US009160105B2

(12) United States Patent
Takaki

(10) Patent No.: US 9,160,105 B2
(45) Date of Patent: Oct. 13, 2015

(54) TERMINAL OF A CONNECTOR INCLUDING TWO CONTACT POINTS

(71) Applicant: IRISO ELECTRONICS CO., LTD., Kanagawa (JP)

(72) Inventor: Masato Takaki, Kanagawa (JP)

(73) Assignee: IRISO ELECTRONICS CO., LTD., Kanagawa (JP)

( * ) Notice: Subject to any disclaimer, the term of this patent is extended or adjusted under 35 U.S.C. 154(b) by 0 days.

(21) Appl. No.: 14/333,869

(22) Filed: Jul. 17, 2014

(65) Prior Publication Data

US 2015/0044915 A1 Feb. 12, 2015

(30) Foreign Application Priority Data

Aug. 8, 2013 (JP) ................................ 2013-165580

(51) Int. Cl.

| | |
|---|---|
| ***H01R 12/00*** | (2006.01) |
| ***H05K 1/00*** | (2006.01) |
| ***H01R 13/627*** | (2006.01) |
| ***H01R 12/71*** | (2011.01) |
| ***H01R 12/73*** | (2011.01) |
| ***H01R 13/11*** | (2006.01) |
| ***H01R 13/193*** | (2006.01) |

(52) U.S. Cl.

CPC .......... *H01R 13/6272* (2013.01); *H01R 12/716* (2013.01); *H01R 12/73* (2013.01); *H01R 13/113* (2013.01); *H01R 13/193* (2013.01)

(58) Field of Classification Search

CPC . H01R 13/2442; H01R 13/2457; H01R 12/57

USPC ........................ 439/733.1, 862, 74; D13/154

See application file for complete search history.

(56) References Cited

U.S. PATENT DOCUMENTS

| | | | | |
|---|---|---|---|---|
| 3,631,381 | A * | 12/1971 | Pittman | 439/637 |
| 6,824,400 | B2 * | 11/2004 | Kashio | 439/83 |
| 7,625,232 | B2 * | 12/2009 | Lin et al. | 439/495 |
| 7,637,783 | B2 * | 12/2009 | Sasaoka et al. | 439/637 |
| 8,480,434 | B2 * | 7/2013 | Funayama et al. | 439/637 |
| 8,672,713 | B2 * | 3/2014 | Tajiri et al. | 439/630 |

(Continued)

FOREIGN PATENT DOCUMENTS

| | | |
|---|---|---|
| EP | 2442405 A1 | 4/2012 |
| JP | 2000-113924 A | 4/2000 |

(Continued)

OTHER PUBLICATIONS

Search Report for European Patent App. No. 14177569.2 (Sep. 5, 2014).

(Continued)

*Primary Examiner* — Hae Moon Hyeon

(74) *Attorney, Agent, or Firm* — Cermak Nakajima & McGowan LLP; Tomoko Nakajima

(57) ABSTRACT

A terminal of a connector includes two contact points, that is, a front contact point and a rear contact point. An angle formed by a line extending from an upper end of a rear terminal portion to the rear contact point and a direction in which the connector is inserted and removed is smaller than an angle formed by a line extending from an upper end of a front terminal portion to the front contact point and the direction in which the connector is inserted and removed. Thus, the insertion force used to insert the rear contact point can be reduced.

9 Claims, 2 Drawing Sheets

(56) References Cited

U.S. PATENT DOCUMENTS

| | | | | |
|---|---|---|---|---|
| 2009/0011651 | A1 | 1/2009 | Lin et al. | |
| 2009/0209142 | A1 * | 8/2009 | Sasaoka et al. | 439/862 |
| 2010/0304583 | A1 | 12/2010 | Busse | |
| 2012/0142226 | A1 * | 6/2012 | Funayama et al. | 439/692 |

FOREIGN PATENT DOCUMENTS

| | | | |
|---|---|---|---|
| JP | 2009-199766 | A | 9/2009 |
| JP | 2012-069243 | A | 4/2012 |
| JP | 5197216 | B2 | 2/2013 |
| JP | 5220888 | B2 | 3/2013 |
| WO | WO2009/082490 | A1 | 7/2009 |

OTHER PUBLICATIONS

Office Action from Korean Patent App. No. 10-2014-0097048 (2014 Aug. 2014).

* cited by examiner

TERMINAL OF A CONNECTOR INCLUDING TWO CONTACT POINTS

BACKGROUND OF THE INVENTION

1. Field of the Invention

The present invention relates to a connector mounted on a member, such as a print circuit board, and used to electrically connect the member to another member. The present invention also relates to a terminal that serves as a contact point of the connector.

2. Description of the Related Art

A pair of connectors for electrically connecting print circuit boards together include a first connector and a second connector. The first connector includes multiple first terminals and a first housing mounted on a first member, and the second connector includes multiple second terminals and a second housing mounted on a second member that is to be connected to the first member. When the first housing and the second housing are fitted together as a result of inserting the second connector into the first connector, the first terminals and the second terminals are in contact with one another, whereby the first and second members are electrically connected together.

Some of the connectors publicly known include terminals each including two contact portions at respective two contact arms in order to establish secure connection between terminals of a first connector and terminals of a second connector. Such connectors are described in, for example, Japanese Patent Nos. 5197216 and 5220888.

In the above-described connector according to the existing technology, the contact pressure at a front contact portion of a front elastic arm, which comes into contact with the companion terminal first, is made higher than the contact pressure at a rear contact portion of a rear elastic arm, which comes into contact with the companion terminal next, so that the rear contact portion of the rear elastic arm can be pressed by the force by which the front contact portion has been pressed for smooth connector fitting. However, the increase of the contact pressure at the front contact portion increases an insertion force exerted to insert the front contact portion and thus increases a resistance exerted at the beginning of insertion (at the beginning of fitting). The existing technology is thus disadvantageous in terms of insertion of the connector.

On the other hand, when the contact pressure at the rear contact portion, which comes into contact with the companion terminal next, is higher than the contact pressure at the front contact portion, which comes into contact with the companion terminal first, an operator may mistake a mere contact of the front contact portion as a completion of fitting the connectors together and stop inserting the connector further, thereby possibly causing fitting failure.

SUMMARY OF THE INVENTION

The present invention was made to address such problems. An object of the present invention is to provide a terminal that is smoothly insertable and unlikely to cause fitting failure and to provide a connector including the terminal.

In order to achieve the above object, provided is a connector that includes a housing and a plurality of terminals held in the housing at intervals in a width direction of the connector, the connector being electrically connected to a companion connector as a result of the terminals respectively coming into contact with companion terminals of the companion connector, wherein each of the terminals includes a fixation portion attached to the housing, a front terminal portion that comes into contact with the companion terminal, a rear terminal portion that comes into contact with the companion terminal after the front terminal portion, and a base end portion that is continuous with the front terminal portion and the rear terminal portion and that supports the front terminal portion and the rear terminal portion when the front terminal portion and the rear terminal portion are elastically deformed as a result of coming into contact with the companion terminal, wherein the front terminal portion includes a front elastic arm and a front contact portion at an end of the front elastic arm, the front contact portion having a front contact point that comes into contact with the companion terminal, wherein the rear terminal portion includes a rear elastic arm and a rear contact portion at an end of the rear elastic arm, the rear contact portion having a rear contact point that comes into contact with the companion terminal, wherein the front terminal portion and the rear terminal portion are made of a flat metal plate including no curvature in a thickness direction and the front elastic arm and the rear elastic arm are continuous with the base end portion at different portions of the base end portion and elastically deformed independently of each other, wherein the front contact point and the rear contact point are each positioned on an edge surface taken in a plate-thickness direction of the metal plate, and wherein a rear insertion angle formed by a rear-contact leading-side edge, extending from an upper end of the rear contact portion to the rear contact point, and an imaginary line extending in a direction in which the connector is inserted or removed is smaller than a front insertion angle formed by a front-contact leading-side edge, extending from an upper end of the front contact portion to the front contact point, and an imaginary line extending in the direction in which the connector is inserted or removed.

In addition, provided is a terminal held in a housing and electrically connecting a connector and a companion connector together as a result of coming into contact with a companion terminal of the companion connector, the terminal including a fixation portion attached to the housing; a front terminal portion that comes into contact with the companion terminal; a rear terminal portion that comes into contact with the companion terminal after the front terminal portion; and a base end portion that is continuous with the front terminal portion and the rear terminal portion and that supports the front terminal portion and the rear terminal portion when the front terminal portion and the rear terminal portion are elastically deformed as a result of coming into contact with the companion terminal, wherein the front terminal portion includes a front elastic arm and a front contact portion at an end of the front elastic arm, the front contact portion having a front contact point that comes into contact with the companion terminal, wherein the rear terminal portion includes a rear elastic arm and a rear contact portion at an end of the rear elastic arm, the rear contact portion having a rear contact point that comes into contact with the companion terminal, wherein the front terminal portion and the rear terminal portion are made of a flat metal plate including no curvature in a thickness direction and the front elastic arm and the rear elastic arm are continuous with the base end portion at different portions of the base end portion and elastically deformed independently of each other, wherein the front contact point and the rear contact point are each positioned on an edge surface taken in a plate-thickness direction of the metal plate, and wherein a rear insertion angle formed by a rear-contact leading-side edge, extending from an upper end of the rear contact portion to the rear contact point, and an imaginary line extending in a direction in which the connector is inserted or removed is smaller than a front insertion angle formed by a front-contact leading-side edge, extending from an upper end of the front contact portion to the front contact point, and an imaginary line extending in the direction in which the connector is inserted or removed.

The terminal included in the connector includes a fixation portion that is attached to the housing. Thus, the terminal can be reliably held by and secured to the housing at the fixation portion. The terminal includes a front terminal portion, which comes into contact with a companion terminal, and a rear terminal portion, which comes into contact with the companion terminal after the front terminal portion. Thus, the terminal can be connected to one companion terminal at two contact points, that is, a front terminal portion and a rear terminal portion. When the terminal is formed by being punched out of a flat metal plate into a punch-out terminal, portions of a surface taken in a plate-thickness direction of the metal plate can be used as contact points. When the terminal has two contact points, the two contact points can be disposed at positions within the range of the plate thickness, whereby the displacement of the contact points can be minimized.

The front terminal portion includes the front elastic arm that extends vertically. Thus, the front terminal portion can be elastically deformed by using the front elastic arm as a spring. The front terminal portion also includes a front contact portion that includes a front contact point that comes into contact with a companion terminal. Thus, the front terminal portion can be brought into contact with the companion terminal. In the same manner as the front terminal portion, the rear terminal portion also includes an elastic arm and a contact portion that includes a contact point. In the same manner as the front terminal portion, the rear terminal portion can thus be elastically deformed and brought into contact with the companion terminal. In this manner, the front terminal portion and the rear terminal portion can be bent independently of each other. In addition, the contact portions can be shaped differently independently of each other and thus the front terminal portion and the rear terminal portion can be designed so as to have insertion forces independent of each other.

The rear insertion angle R1 formed by the rear-contact leading-side edge, extending from an upper end of the rear contact portion to the rear contact point, and an imaginary line extending in a direction in which the connector is inserted and removed is smaller than a front insertion angle F1 formed by the front-contact leading-side edge, extending from an upper end of the front contact portion to the front contact point, and an imaginary line extending in the direction in which the connector is inserted and removed. Thus, the insertion force used to insert the rear terminal portion is increased to a lesser extent than the insertion force used to insert the front terminal portion. In other words, if the insertion reliability is improved by reducing the contact pressure at the front terminal portion (relatively increasing the contact pressure at the rear terminal portion), a fitting failure such as incomplete insertion of the connector is more likely to occur. However, the reduction of the rear insertion angle enables a reduction of an insertion force used to insert the rear terminal portion.

In addition, the contact pressure at the rear terminal portion can be made higher than the contact pressure at the front terminal portion. Since the contact pressure at the rear terminal portion is made higher than the contact pressure at the front terminal portion, the contact pressure at the front terminal portion, which comes into contact with a companion terminal first, is made lower, whereby the connector can be more smoothly inserted when being fitted to the companion connector.

The difference between the insertion force used to insert the front contact point and the insertion force used to insert the rear contact point can be brought into the range of 30% the smaller one of the insertion force used to insert the front contact point and the insertion force used to insert the rear contact point. Since the difference between the insertion force used to insert the front contact point and the insertion force used to insert the rear contact point is brought into the range of 30% the smaller one of the insertion force used to insert the front contact point and the insertion force used to insert the rear contact point, the insertion force used to insert the front contact point and the insertion force used to insert the rear contact point become substantially equal to each other, whereby insertion of the front contact point and insertion of the rear contact point can be performed at once without any uncomfortable feeling. The connector is smoothly inserted and thus fitting failure such as incomplete insertion of the connector involving only insertion of the front contact point is less likely to occur.

The front contact-point angle F2 formed by the front-contact trailing-side edge, extending from the front elastic arm to the front contact point, and the front-contact leading-side edge can be made larger than 90 degrees. Since the front contact-point angle F2 formed by the front-contact trailing-side edge, extending from the front elastic arm to the front contact point, and the front-contact leading-side edge is made larger than 90 degrees, the front contact portion can easily exert its impurity removal function.

The connector and the terminal according to some embodiments of the present invention are smoothly inserted when being fitted to a companion connector and are less likely to cause fitting failure such as fitting failure of the rear contact portion. Thus, the connector and the terminal are easily operable and can establish reliable fitting and electrical connection.

DESCRIPTION OF THE PREFERRED EMBODIMENTS

The invention is described further in detail using an embodiment.

Figure 1:
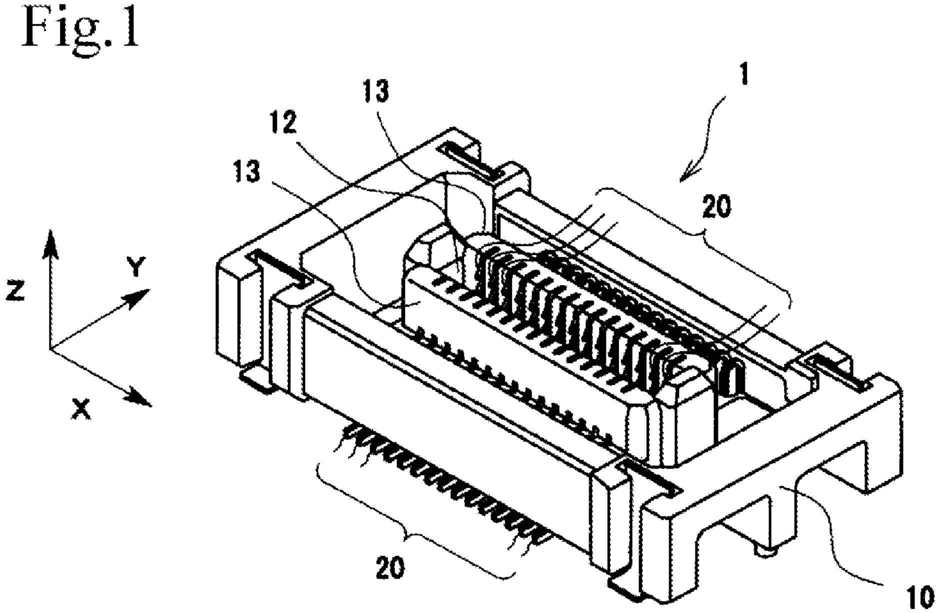
FIG. 1 is a perspective view of a connector.

FIG. 1 is a perspective view of a connector 1 in which terminals 20 are attached to a housing 10. The connector 1 is to be mounted on a member (not illustrated), such as a print circuit board. The connector 1 is to be fitted to a companion connector (not illustrated) mounted on another member such as a print circuit board and configured to electrically connect the print circuit boards together as a result of the terminals 20 of the connector 1 coming into contact with companion terminals of the companion connector.

In the description or the scope of claims, for the sake of convenience, the X direction in FIG. 1 is defined as a width direction, the Y direction in FIG. 1 is defined as a front-rear direction, and the Z direction in FIG. 1 is defined as a vertical direction. These directions, however, are not meant to limit the directions in which the connector 1 is installed or used.

The connector 1 includes a housing 10 in which terminals 20 are arranged at intervals in the width direction, the housing 10 being fitted to a companion connector. The housing 10 is molded out of a synthetic resin and includes vertical walls 13 and terminal fixing grooves, not illustrated, for securing the terminals 20. The vertical walls 13 define a groove 12 that receives the companion connector and are fitted to the connector.

Figure 2:
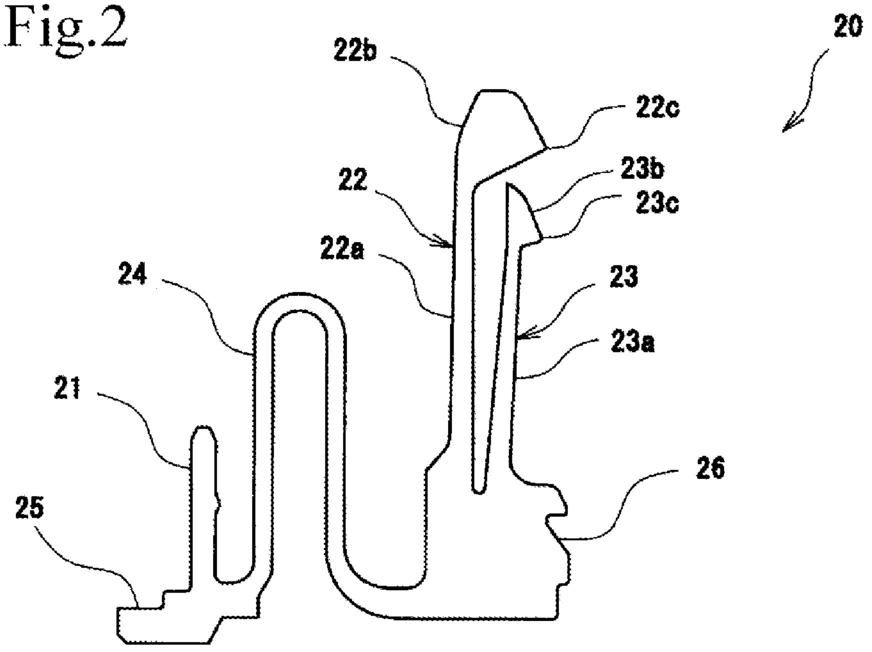
FIG. 2 is a plan view of a terminal.

Each terminal 20 is formed by being punched out from an electroconductive metal sheet in the thickness direction. As illustrated in FIG. 2, each terminal 20 includes a fixation portion 21 used for fixing the terminal 20 to the housing 10, a front terminal portion 22 and a rear terminal portion 23 elastically deformable in the front-rear direction, a third elastic arm 24 disposed between the fixation portion 21 and the front and rear terminal portions 22 and 23, a connection portion 25 that is to be connected to a circuit board, and a base end portion 26 continuous with the ends of the front and rear terminal portions 22 and 23. The multiple terminals 20 are attached to the housing 10 in such a manner as to be arranged in rows in the width direction and in such a manner that the direction of the thickness of the fixation portion 21 or the terminal portions 22 and 23 is aligned with the width direction.

The front terminal portion 22 includes a vertically stretchable front elastic arm 22*a* and a front contact portion 22*b* at the end of the front elastic arm 22*a*. The front contact portion 22*b* has a front contact point 22*c* that comes into contact with the companion terminal. As in the case of the front terminal portion 22, the rear terminal portion 23 includes a rear elastic arm 23*a* and a rear contact portion 23*b* having a rear contact point 23*c*.

Preferably, the contact pressure at the rear contact point 23*c* is higher than the contact pressure at the front contact point 22*c*. Increasing the contact pressure at the rear contact point 23*c* is one way of facilitating smooth insertion of the terminal in view of the existing technology with which insertion of the terminal is poorly performed since the contact pressure at the contact point that comes into contact with the companion terminal first, that is, the contact pressure at the front contact point 22*c* is higher.

In addition, the terminal portions 22 and 23 can be so formed that the rear contact point 23*c* is positioned so as to protrude toward the companion terminal in the front-rear direction beyond the position of the front contact point 22*c*. By positioning the rear contact point 23*c* in this manner, the contact pressure of the rear contact point 23*c* can be easily increased.

Figure 3:
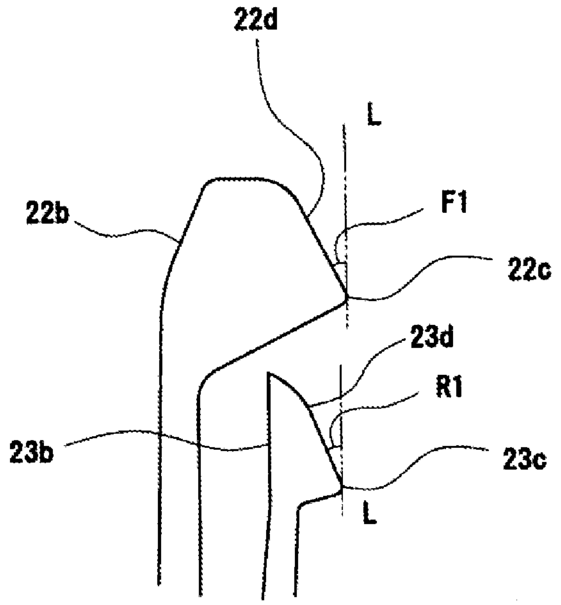
FIG. 3 illustrates a portion of the terminal illustrated in FIG. 2 in an enlarged manner.

FIG. 3 illustrates a portion of the terminal 20 in an enlarged manner. At the front contact portion 22*b*, a front insertion angle F1 can be imaginarily formed by a front-contact leading-side edge 22*d*, extending from the upper end of the front contact portion 22*b* to the front contact point 22*c*, and an imaginary line L extending in a direction in which the connector is inserted or removed. Similarly, at the rear contact portion 23*b*, a rear insertion angle R1 can be imaginarily formed by a rear-contact leading-side edge 23*d*, extending from the upper end of the rear contact portion 23*b* to the rear contact point 23*c*, and an imaginary line L extending in the direction in which the connector is inserted or removed.

Here, the contact portions 22*b* and 23*b* are so formed that the rear insertion angle R1 is smaller than the front insertion angle F1.

More specifically, the front insertion angle F1 is preferably 15 degrees to 45 degrees and the rear insertion angle R1 is preferably smaller than the front insertion angle F1. This is because the front insertion angle F1 that exceeds 45 degrees requires an excessively large force to insert the front terminal portion, whereby the insertion of the front terminal portion becomes difficult. On the other hand, the front insertion angle F1 that falls below 15 degrees diminishes the impurity removing effect of the front contact portion 22*b*. Moreover, preferably, the minimum degree of the rear insertion angle R1 does not fall below 10 degrees. If the minimum degree falls below 10 degrees, the rear contact portion 23*b* is excessively extended in the vertical direction to increase the distance between the contact points 22*c* and 23*c*, whereby connectors fail to be compactly fitted together.

The insertion force (insertion pressure) exerted when the connector 1 is inserted into the companion connector is determined by, besides the contact pressure, the angle at the contact point with respect to the insertion-removal direction, that is, a function of the front insertion angle F1 or the rear insertion angle R1. Thus, reduction of the rear insertion angle R1 enables minimization of an effect on an increase of the insertion force used to insert the rear contact point 23*c*. In other words, even when the contact pressure at the rear contact point 23*c* becomes relatively larger than the contact pressure at the front contact point 22*c* by reducing the contact pressure at the front contact point 22*c* or by increasing the contact pressure at the rear contact point 23*c*, the insertion force used to insert the rear contact point 23*c* is not increased to such a degree as the increase of the contact pressure at the rear contact point 23*c* since the rear insertion angle R1 is made smaller than the front insertion angle F1. By reducing the rear insertion angle R1 in this manner, the insertion force used to insert the rear terminal portion 23 can be reduced even when the contact pressure at the rear terminal portion 23 is increased. Thus, the insertion force at the front terminal portion 22 and the insertion force at the rear terminal portion 23 can be approximated to each other, thereby minimizing fitting failure.

For example, when the contact pressure at the front contact point 22*c* is 0.5 N, the contact pressure at the rear contact point 23*c* is 0.6 N, and the front insertion angle F1 and the rear insertion angle R1 are 35 degrees, the insertion forces required to insert the front contact portion 22*b* and the rear contact portion 23*b* can be 0.54 N/PIN and 0.76 N/PIN, respectively. On the other hand, when only the rear insertion angle R1 is changed to 22 degrees while the other conditions remain the same, the insertion force used to insert the front contact portion 22*b* remains 0.54 N/PIN, whereas the insertion force used to insert the rear contact portion 23*b* can be changed to 0.52 N/PIN.

Figure 4:
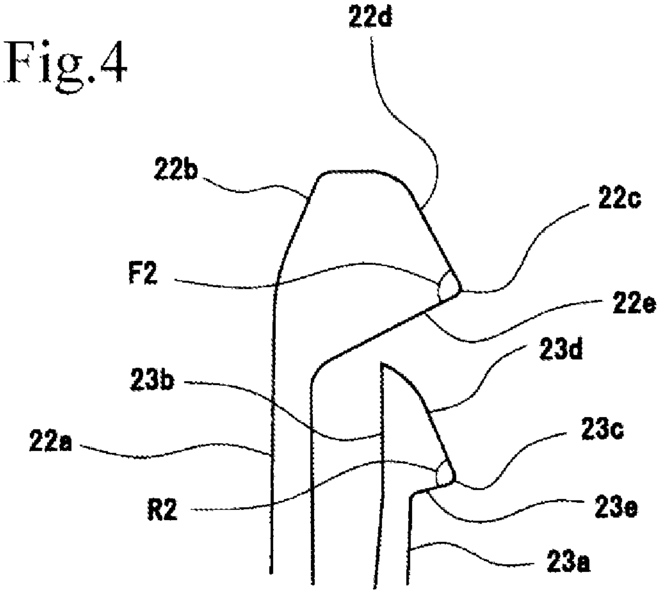
FIG. 4 illustrates a portion of the terminal illustrated in FIG. 2 in an enlarged manner as in the case of FIG. 3.

As in the case of FIG. 3, FIG. 4 illustrates a portion of the terminal 20 in an enlarged manner. A front contact-point angle F2 is formed by the front-contact leading-side edge 22*d* and a front-contact trailing-side edge 22*e* extending from the front elastic arm 22*a* to the front contact point 22*c*. Similarly, at the rear contact portion 23*b*, a rear contact-point angle R2 is formed by the rear-contact leading-side edge 23*d* and a rear-contact trailing-side edge 23*e* extending from the rear elastic arm 23*a* to the rear contact point 23*c*.

Among these contact-point angles F2 and R2, the front contact-point angle F2 is preferably larger than 90 degrees. In addition, the rear contact-point angle R2 is preferably smaller than the front contact-point angle F2. The reason why the front contact-point angle F2 is preferably larger than 90 degrees is because such a front contact portion 22*b* can effectively function as a member of removing impurities adhering to the companion contact point.

In the case where the front contact-point angle R2 is small, after the front contact point 22*c* touches impurities, the impurities are likely to be pushed aside to both sides of the front contact point 22*c* and moved to right behind the front contact point 22*c*, or, after the front contact point 22*c* touches impurities, the impurities are likely to cross over the front contact point 22*c* and moved to right behind the front contact point 22*c*. On the other hand, when the front contact-point angle R2 is larger than 90 degrees, the area of the front contact portion 22*b* in the plane direction is large. Thus, impurities are unlikely to be moved to right behind the front contact point 22*c* or to cross over the front contact point 22*c*. Thus, the impurities that have touched the front contact point 22*c* become less likely to also touch the rear contact point 23*c*, whereby the impurities are effectively removed.

Preferably, the front contact-point angle F2 is smaller than or equal to 95 degrees. If the front contact-point angle F2 exceeds 95 degrees, the rear contact portion 23*b* has to be disposed at a lower portion, whereby the distance between the contact points 22*c* and 23*c* is increased and the connector fails to be compactly fitted to a companion connector.

The reason why the rear contact-point angle R2 is made smaller than the front contact-point angle F2 is because the rear contact portion 23*b* is not required to have an impurity removal function unlike the front contact portion 22*b*.

The third elastic arm 24 has an inverted U shape and disposed between the end continuous with the fixation portion 21 and the other end continuous with the base end portion 26. The vertical walls 13 are movable in the front-rear direction by elastically deforming the inverted-U-shaped third elastic arms 24 in the front-rear direction.

The connection portion 25 protrudes to the outside from the housing 10. The connection portion 25 is electrically conducted and connected to a circuit board by being, for example, soldered to a contact point on the circuit board.

The base end portion 26 serves as base ends of the terminal portions 22 and 23 and is also used for fixing the terminal 20 to the housing 10 in the same manner as in the case of the fixation portion 21.

A companion connector (not illustrated) includes a companion housing, which is fitted to the housing 10 of the connector 1, and multiple companion terminals disposed in the companion housing at intervals in the width direction. When the connector 1 and the companion connector are to be fitted together, the companion connector is inserted into the groove 12 of the connector 1 so that both housings are fitted together and the multiple terminals 20 of the connector 1 respectively come into contact with the multiple companion terminals. Here, the front contact point 22*c* and the rear contact point 23*c* of each terminal 20 come into contact with the corresponding companion terminal at the same position in the width direction but apart from each other in the vertical direction. Thus, each terminal 20 comes into contact with the corresponding companion terminal at two contact points. In this manner, both connectors are electrically conducted and connected together.

Each terminal 20 includes two terminal portions, i.e., the front terminal portion 22 and the rear terminal portion 23. Thus, even in the case where impurities adhere to a companion terminal, the front contact portion 22*b* including the front contact point 22*c*, which comes into contact with the companion terminal first, removes the impurities and the rear contact point 23*c* can be brought into contact with the companion terminal after the front contact point 22*c* has removed the impurities. In this manner, the front contact portion 22*b* can remove impurities. Even when the front contact point 22*c* fails to be electrically conducted to the companion terminal due to the impurities, the rear contact point 23*c* can be reliably electrically conducted to the companion terminal. Thus, circuit boards connected to the connectors can be reliably electrically conducted together.

When terminals are formed by being punched out from an electrically conductive metal plate in the thickness direction and their surfaces taken in the plate-thickness direction are used as contact points, a large number of terminals can be arranged in a small space in the metal-plate thickness direction, whereby terminals 20 can be highly densely disposed in the width direction of the connector 1.

The above-described embodiment is one embodiment of the prevent invention. The present invention is not limited to the above-described embodiment and can be appropriately modified within the scope not departing from the gist of the invention.

For example, instead of mounting the terminals 20 on the housing 10, which is a socket-type housing, the terminals 20 may be mounted on a plug-type housing, which is a companion housing. The shapes, the sizes, the positions, and the numbers of the fixation portion 21, the connection portion 25, the third elastic arm 24, and the base end portion 26 can be appropriately changed. The third elastic arm 24 may be changed in various manners or may not be provided. The shapes, the positions, and other conditions of the elastic arms of the front terminal portion 22 and the rear terminal portion 23 can be appropriately changed. In addition, other components, such as a third contact point other than the front contact point and the rear contact point may be additionally provided.

What is claimed is:

1. A connector comprising a housing and a plurality of terminals held in the housing at intervals in a width direction of the connector, the connector being electrically connected to a companion connector as a result of the terminals respectively coming into contact with companion terminals of the companion connector, wherein each of the terminals includes
- a fixation portion attached to the housing,
- a front terminal portion that comes into contact with the companion terminal,
- a rear terminal portion that comes into contact with the companion terminal after the front terminal portion, and
- a base end portion, fixed to the housing, that is continuous with the front terminal portion and the rear terminal portion and that supports the front terminal portion and the rear terminal portion when the front terminal portion and the rear terminal portion are elastically deformed as a result of coming into contact with the companion terminal, wherein the front terminal portion includes a front elastic arm and a front contact portion at an end of the front elastic arm, the front contact portion having a front contact point that comes into contact with the companion terminal, wherein the rear terminal portion includes a rear elastic arm and a rear contact portion at an end of the rear elastic arm, the rear contact portion having a rear contact point that comes into contact with the companion terminal, wherein the front terminal portion and the rear terminal portion are made of a flat metal plate including no curvature in a thickness direction and the front elastic arm and the rear elastic arm are continuous with the base end portion at different portions of the base end portion and elastically deformed independently of each other, wherein the front contact point and the rear contact point are each positioned on an edge surface taken in a plate-thickness direction of the metal plate, and wherein a rear insertion angle formed by a rear-contact leading-side edge, extending from an upper end of the rear contact portion to the rear contact point when the companion terminal comes into contact with the front terminal portion, and an imaginary line extending in a direction in which the connector is inserted or removed is smaller than a front insertion angle formed by a front-contact leading-side edge, extending from an upper end of the front contact portion to the front contact point before the companion terminal comes into contact with the front terminal portion, and an imaginary line extending in the direction in which the connector is inserted or removed.

2. The connector according to claim 1, wherein a contact pressure at the rear terminal portion is higher than a contact pressure at the front terminal portion.

3. The connector according to claim 1, wherein a difference between a force used to insert the front contact point and a force used to insert the rear contact point falls within 30% a smaller one of the force used to insert the front contact point and the force used to insert the rear contact point.

4. The connector according to claim 1, wherein the front contact-point angle formed by the front-contact trailing-side edge, extending from the front elastic arm to the front contact point, and the front-contact leading-side edge exceeds 90 degrees.

5. The connector according to claim 1, wherein the rear contact point that comes into contact with the companion terminal is positioned so as to protrude toward the companion terminal beyond the front contact point.

6. A terminal held in a housing and electrically connecting a connector and a companion connector together as a result of coming into contact with a companion terminal of the companion connector, the terminal comprising:

a fixation portion attached to the housing;

a front terminal portion that comes into contact with the companion terminal;

a rear terminal portion that comes into contact with the companion terminal after the front terminal portion; and a base end portion, fixed to the housing, that is continuous with the front terminal portion and the rear terminal portion and that supports the front terminal portion and the rear terminal portion when the front terminal portion and the rear terminal portion are elastically deformed as a result of coming into contact with the companion terminal, wherein the front terminal portion includes a front elastic arm and a front contact portion at an end of the front elastic arm, the front contact portion having a front contact point that comes into contact with the companion terminal, wherein the rear terminal portion includes a rear elastic arm and a rear contact portion at an end of the rear elastic arm, the rear contact portion having a rear contact point that comes into contact with the companion terminal, wherein the front terminal portion and the rear terminal portion are made of a flat metal plate including no curvature in a thickness direction and the front elastic arm and the rear elastic arm are continuous with the base end portion at different portions of the base end portion and elastically deformed independently of each other, wherein the front contact point and the rear contact point are each positioned on an edge surface taken in a plate-thickness direction of the metal plate, and wherein a rear insertion angle formed by a rear-contact leading-side edge, extending from an upper end of the rear contact portion to the rear contact point when the companion terminal comes into contact with the front terminal portion, and an imaginary line extending in a direction in which the connector is inserted or removed is smaller than a front insertion angle formed by a front-contact leading-side edge, extending from an upper end of the front contact portion to the front contact point before the companion terminal comes into contact with the front terminal portion, and an imaginary line extending in the direction in which the connector is inserted or removed.

7. The terminal according to claim 6, wherein a contact pressure at the rear terminal portion is higher than a contact pressure at the front terminal portion.

8. The terminal according to claim 6, wherein a difference between a force used to insert the front contact point and a force used to insert the rear contact point falls within 30% a smaller one of the force used to insert the front contact point and the force used to insert the rear contact point.

9. The terminal according to claim 6, wherein the front contact-point angle formed by the front-contact trailing-side edge, extending from the front elastic arm to the front contact point, and the front-contact leading-side edge exceeds 90 degrees.

* * * * *